United States Patent
Baker et al.

(10) Patent No.: US 8,148,244 B2
(45) Date of Patent: Apr. 3, 2012

(54) LATERAL GROWTH METHOD FOR DEFECT REDUCTION OF SEMIPOLAR NITRIDE FILMS

(75) Inventors: Troy J. Baker, Santa Barbara, CA (US); Benjamin A. Haskell, Santa Barbara, CA (US); James S. Speck, Goleta, CA (US); Shuji Nakamura, Santa Barbara, CA (US)

(73) Assignees: The Regents of the University of California, Oakland, CA (US); Japan Science and Technology Agency (JP)

( * ) Notice: Subject to any disclaimer, the term of this patent is extended or adjusted under 35 U.S.C. 154(b) by 1269 days.

(21) Appl. No.: 11/486,224

(22) Filed: Jul. 13, 2006

(65) Prior Publication Data
US 2007/0015345 A1    Jan. 18, 2007

Related U.S. Application Data

(60) Provisional application No. 60/698,749, filed on Jul. 13, 2005.

(51) Int. Cl.
*H01L 21/20* (2006.01)
*H01L 21/36* (2006.01)

(52) U.S. Cl. ................. 438/481; 257/E21.133

(58) Field of Classification Search .......... 257/E21.133, 257/E21.131–E21.132; 438/481
See application file for complete search history.

(56) References Cited

U.S. PATENT DOCUMENTS

| | | | |
|---|---|---|---|
| 6,153,010 A | 11/2000 | Kiyoku et al. | |
| 6,316,785 B1 | 11/2001 | Nunoue et al. | |
| 6,440,823 B1 | 8/2002 | Vaudo et al. | |
| 6,593,589 B1 | 7/2003 | Osinski et al. | |
| 6,599,362 B2 | 7/2003 | Ashby et al. | |
| 6,828,591 B2 | 12/2004 | Okuyama et al. | |
| 6,847,057 B1 | 1/2005 | Gardner et al. | |
| 6,900,070 B2 | 5/2005 | Craven et al. | |
| 7,091,514 B2 | 8/2006 | Craven et al. | |
| 7,186,302 B2 | 3/2007 | Chakraborty et al. | |
| 7,220,324 B2 | 5/2007 | Baker et al. | |
| 7,220,658 B2 | 5/2007 | Haskell et al. | |
| 7,361,576 B2 * | 4/2008 | Imer et al. | 438/479 |
| 2002/0144645 A1 | 10/2002 | Kim et al. | |

(Continued)

FOREIGN PATENT DOCUMENTS

EP    1385196 A2    1/2004

(Continued)

OTHER PUBLICATIONS

Cheong et al. Phys. Stat. Sol. (b) 2004, 241, 2763.*

(Continued)

*Primary Examiner* — Matthew Landau
*Assistant Examiner* — Sonya McCall Shepard
(74) *Attorney, Agent, or Firm* — Gates & Cooper LLP

(57) ABSTRACT

A lateral growth method for defect reduction of semipolar nitride films. The process steps include selecting a semipolar nitride plane and composition, selecting a suitable substrate for growth of the semipolar nitride plane and composition, and applying a selective growth process in which the semipolar nitride nucleates on some areas of the substrate at the exclusion of other areas of the substrate, wherein the selective growth process includes lateral growth of nitride material by a lateral epitaxial overgrowth (LEO), sidewall lateral epitaxial overgrowth (SLEO), cantilever epitaxy or nanomasking.

19 Claims, 7 Drawing Sheets

U.S. PATENT DOCUMENTS

| | | | |
|---|---|---|---|
| 2003/0024475 A1 | 2/2003 | Anderson | |
| 2003/0198837 A1 | 10/2003 | Craven et al. | |
| 2003/0230235 A1* | 12/2003 | Craven et al. | 117/103 |
| 2004/0087115 A1 | 5/2004 | Nagai et al. | |
| 2005/0142391 A1 | 6/2005 | Dmitriev et al. | |
| 2005/0161697 A1 | 7/2005 | Nakahata et al. | |
| 2005/0258451 A1 | 11/2005 | Saxler et al. | |
| 2006/0008941 A1 | 1/2006 | Haskell et al. | |
| 2006/0237709 A1 | 10/2006 | Lee et al. | |
| 2006/0270076 A1 | 11/2006 | Imer et al. | |
| 2007/0093073 A1 | 4/2007 | Farrell et al. | |

FOREIGN PATENT DOCUMENTS

| | | |
|---|---|---|
| WO | 03/089694 A1 | 10/2003 |
| WO | WO 2004061909 A1 * | 7/2004 |

OTHER PUBLICATIONS

Baker at al., JJAP 2005, 44, 920.*

Nichizuka, K., "Efficient Radiative Recombination From <1122>-oriented InxGa1-xN Multiple Quantum Wells Fabricated by the Regrowth Technique," Applied Physics Letters, Oct. 2004, vol. 85, No. 15, pp. 3122-3124, abstract.

Sharma, R., "Demonstration of a Semipolar (1013) InGaN/GaN Green Light Emitting Diode," Applied Physics Letters, Nov. 2005, vol. 87, 231110, pp. 1-3, abstract.

Patent Abstracts of Japan, vol. 2002, No. 4, Aug. 4, 2002 & JP 2001 342100 A (Toshiba Corp), Dec. 11, 2001.

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Haskell, B.A., "Defect reduction in (1120) a-plane gallium nitride via lateral epitaxial overgrowth by hydride vapor phase epitaxy," Appl. Phy. Lett. 2003, 83(4):644-646.

Haskell, B.A., "Defect reduction in (1100) m-plane gallium nitride via lateral epitaxial overgrowth by hydride vapor phase epitaxy," Appl. Phys. Lett. 2005, 86:111917-111917-3.

Shao, Y-P. et al., "Electrical Characterization of Semipolar Gallium Nitride Thin Films," NNIN REU Research Accomplishments, Aug. 2005, pp. 132-133.

Kamiyama, S. et al., "GaN growth on (3038) 4H-SiC substrate for reduction of internal polarization," Phys. Stat. Sol. (c) 2, No. 7, 2121-2124 (2005).

Shao, Y., "Electrical characterization of semipolar gallium nitride thin films," 2005 NNIN REU Research Accomplishments, 132-133 (2005).

* cited by examiner

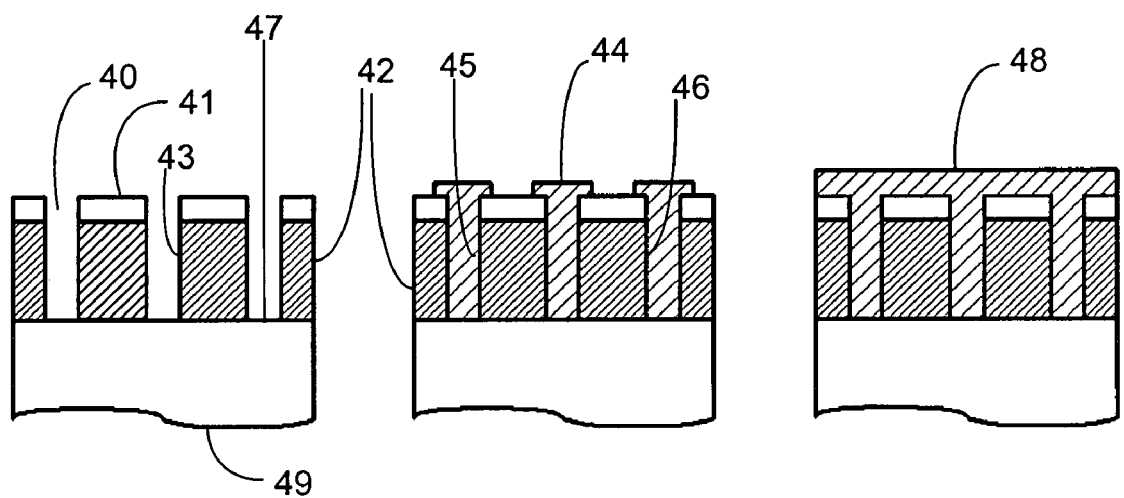
FIG. 4(a)  FIG. 4(b)  FIG. 4(c)

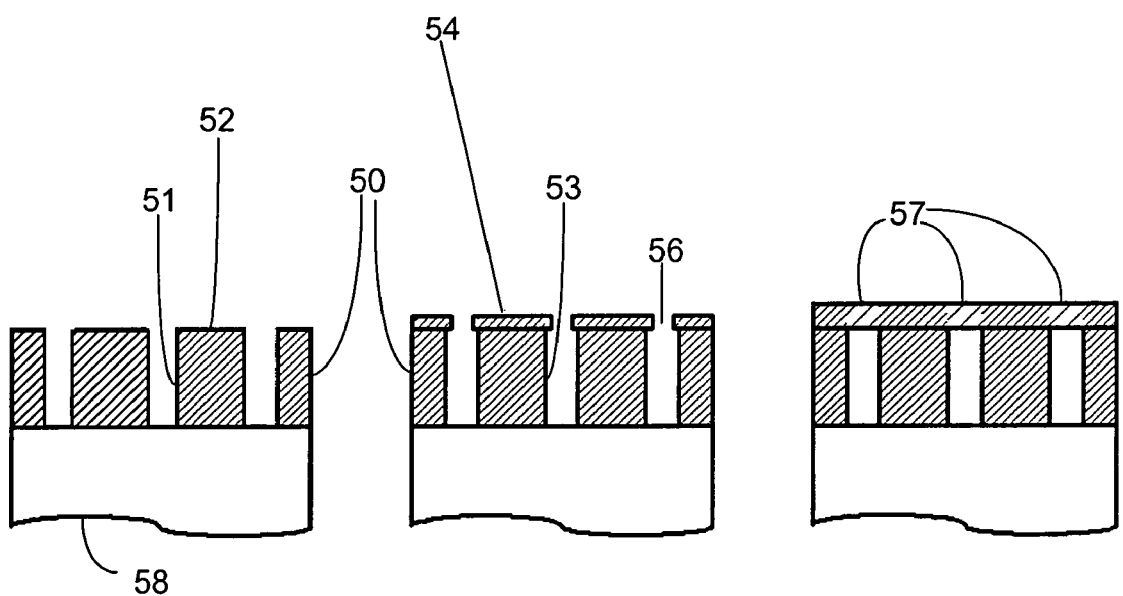
FIG. 5(a)  FIG. 5(b)  FIG. 5(c)

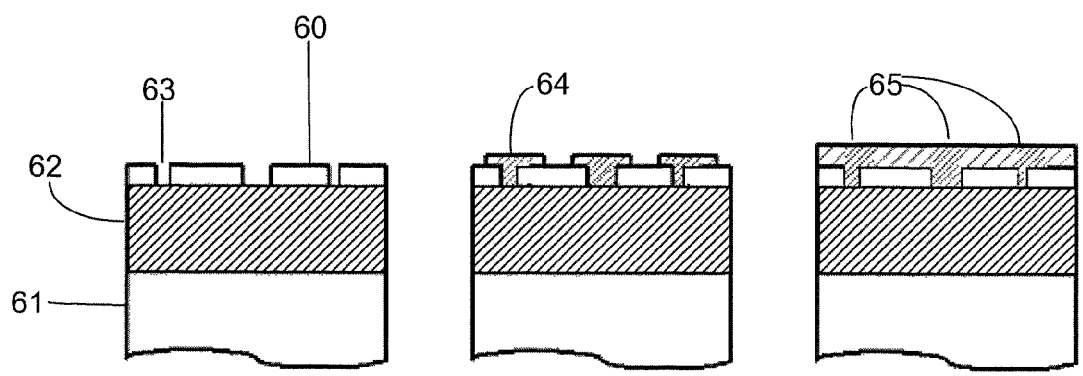
FIG. 6(a)  FIG. 6(b)  FIG. 6(c)

LATERAL GROWTH METHOD FOR DEFECT REDUCTION OF SEMIPOLAR NITRIDE FILMS

CROSS-REFERENCE TO RELATED APPLICATIONS

This application claims the benefit under 35 U.S.C. Section 119(e) of the following commonly-assigned U.S. patent application:

U.S. Provisional Patent Application Ser. No. 60/698,749, filed on Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS";

which application is incorporated by reference herein.

This application is related to the following commonly-assigned applications:

U.S. Utility patent application Ser. No. 10/537,644, filed on Jun. 6, 2005, now U.S. Pat. No. 7,220,658, issued May 22, 2007, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,", which application claims the benefit under 35 U.S.C. Section 365(c) of PCT International Patent Application Ser. No. PCT/US03/21918, filed on Jul.15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,", which application claims the benefit under 35 U.S.C. Section 119(e) of U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,";

U.S. Utility patent application Ser. No. 10/537,385, filed on Jun. 3, 2005, now U.S. Pat. No. 7,427,555, issued Sep. 23, 2008, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY,", which application claims the benefit under 35 U.S.C. Section 365(c) of PCT International Patent Application Ser. No. PCT/US03/21916, filed on Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY,", which application claims the benefit under 35 U.S.C. Section 119(e) of U.S. Provisional Patent Application Ser. No. 60/433,844, filed Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY,";

U.S. Utility patent application Ser. No. 10/413,691, filed on Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION,", which application claims the benefit under 35 U.S.C. Section 119(e) of U.S. Provisional Patent Application Ser. No. 60/372,909, filed on Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

U.S. Utility patent application Ser. No. 10/413,690, filed on Apr. 15, 2003, now U.S. Pat. No. 7,091,514, issued Aug. 15, 2006, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES,", which application claims the benefit under 35 U.S.C. Section 119(e) of U.S. Provisional Patent Application Ser. No. 60/372,909, filed on Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

U.S. Utility patent application Ser. No. 10/413,913, filed on Apr. 15, 2003, by Michael D. Craven, Steven P. DenBaars and James S. Speck, entitled "DISLOCATION REDUCTION IN NON-POLAR GALLIUM NITRIDE THIN FILMS,", now U.S. Pat. No. 6,900,070, issued May 31, 2005, which application claims the benefit under 35 U.S.C. Section 119(e) of U.S. Provisional Patent Application Ser. No. 60/372,909, filed on Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

U.S. Utility patent application Ser. No. 11/123,805, filed on May 6, 2005, now U.S. Pat. No. 7,186,302, issued Mar. 6, 2007, by Arpan Chakraborty, Benjamin A. Haskell, Stacia Keller, James S. Speck, Steven P. DenBaars, Shuji Nakamura, and Umesh K. Mishra, entitled "FABRICATION OF NON-POLAR INDIUM GALLIUM NITRIDE THIN FILMS, HETEROSTRUCTURES AND DEVICES BY METALORGANIC CHEMICAL VAPOR DEPOSITION,", which application claims the benefit under 35 U.S.C. Section 119(e) of U.S. Provisional Patent Application Ser. No. 60/569,749, filed on May 10, 2004, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR InGaN THIN FILMS, HETEROSTRUCTURES AND DEVICES BY METALORGANIC CHEMICAL VAPOR DEPOSITION,";

U.S. Utility patent application Ser. No. 11/372,914, filed on March 10, 2006, now U.S. Pat. No. 7,220,324, issued May 22, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMIPOLAR GALLIUM NITRIDE,", which claims the benefit under 35 U.S.C. Section 119(e) of U.S. Provisional Patent Application Ser. No. 60/660,283, filed on Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMIPOLAR GALLIUM NITRIDE,";

U.S. Utility patent application Ser. No. 11/444,084, filed on May 31, 2006, now U.S. Pat. No. 7,361,576, issued Apr. 22, 2008, by Bilge M. Imer, James S. Speck and Steven P. DenBaars, entitled "DEFECT REDUCTION OF NON-POLAR AND SEMI-POLAR III-NITRIDES WITH SIDEWALL LATERAL EPITAXIAL OVERGROWTH (SLEO),", which claims the benefit under 35 U.S.C. Section 119(e) of U.S. Provisional Patent Application Ser. No. 60/685,952, filed on May 31, 2005, by Bilge M. Imer, James S. Speck and Steven P. Denbaars, entitled "DEFECT REDUCTION OF NON-POLAR GALLIUM NITRIDE WITH SINGLE-STEP SIDEWALL LATERAL EPITAXIAL OVERGROWTH,";

U.S. Utility patent application Ser. No. 11/444,946, filed on Jun. 1, 2006, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES,", which claims the benefit under 35 U.S.C. Section 119(e) of U.S. Provisional Application Ser. No. 60/686,244, entitled "TECHNIQUE FOR THE GROWTH AND FABRICATION OF SEMIPOLAR (Ga,Al,In,B)N THIN FILMS, HETEROSTRUCTURES, AND DEVICES," filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, ;

U.S. Provisional Application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Provisional Application Ser. No. 60/760,628, filed on Jan. 20, 2006, by Hitoshi Sato, John F. Kaeding, Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Provisional Application Ser. No. 60/772,184, filed on Feb. 10, 2006, by John F. Kaeding, Hitoshi Sato, Michael Iza, Hirokuni Asamizu, Hong Zhong, Steven P. DenBaars and Shuji Nakamura, entitled "METHOD FOR CONDUCTIVITY CONTROL OF SEMIPOLAR (Al,In,Ga,B)N,"; and U.S. Provisional Application Ser. No. 60/774,467, filed on Feb. 17, 2006, by Hong Zhong, John F. Kaeding, Rajat Sharma, James S. Speck, Steven P. DenBaars, and Shuji Nakamura, entitled "METHOD FOR GROWTH OF SEMIPOLAR (Al,In,Ga,B) N OPTOELECTRONIC DEVICES,";

all of which applications are incorporated by reference herein.

BACKGROUND OF THE INVENTION

1. Field of the Invention

The present invention is related to semiconductor materials, methods, and devices, and more particularly, to a lateral growth method for defect reduction of semipolar nitride films.

2. Description of the Related Art

Gallium nitride (GaN) and its alloys with indium (In) and aluminum (Al) (referred to as (Al, In, Ga)N or nitrides) are currently used to produce visible and ultraviolet optoelectronic devices and high power electronic devices. Nitride films are grown heteroepitaxially by techniques such as metalorganic chemical vapor deposition (MOCVD), molecular beam epitaxy (MBE), and hydride vapor phase epitaxy (HVPE). Nitride light emitting diodes (LEDs) and laser diodes (LDs) are currently commercially available.

The most stable structure of nitrides is the hexagonal würtzite structure. In würtzite, there is a unique c-axis, and two or three a-axes, depending on choice of unit cell. This phase consists of alternate stacking of cation and anion planes in the c-direction. The planes have hexagonal symmetry and have a stacking sequence of AaBb along this c-axis, where upper case represents anions and lowercase represents cations, and the letters represent the stacking sequence along the c-direction. The stacking sequence of AaBb, i.e., A (11) a (12) B (13) b (14), is shown in FIG. 1, viewed perpendicular to the c-axis.

Current state of the art group III-nitride devices are grown in the c-plane orientation. However, the symmetry of the würtzite structure dictates that there will be a net polarization vector normal to the c-plane (i.e., along the c-direction). This polarization is detrimental to the performance of optoelectronic devices, as it causes band bending and an effect known as the quantum confined stark effect in quantum wells. The most important results of this are decreased radiative recombination efficiency, red shifted emission, and blue shifting of the emission with increasing drive current. The decreased recombination efficiency results from the spatial separation of the electron and hole wave functions. The red shift in emission is due to band bending, and the emission blue shifts with increasing drive current as the applied field overcomes the built-in polarization fields.

The total polarization is a sum of the spontaneous and piezoelectric polarization. The spontaneous polarization is an intrinsic property of the crystal and depends only on the composition of the nitride alloy. The piezoelectric polarization is a result of strain experienced by the lattice. There is usually strain in heterostructures such as InGaN quantum wells (QWs) on GaN, as layers of different composition in nitride heterostructures generally have different lattice constants from one another. The piezoelectric polarization increases with increasing strain, thus the polarization increases as the In composition is increased in InGaN/GaN QWs. This effect has made the fabrication of green LEDs very difficult and the fabrication of green LDs virtually impossible for current c-plane orientation nitrides.

The nitrides do not lend themselves to bulk crystal growth for several reasons. First, GaN is a refractory material and must be synthesized at elevated temperatures. Second, a very high over-pressure of nitrogen is required to prevent GaN from decomposing at elevated temperatures. Third, the high bond strength of the $N_2$ molecule complicates nitrogen incorporation into GaN crystals. As bulk GaN crystals are not widely available, current devices are grown on foreign substrates heteroepitaxially. The nature of heteroepitaxial growth leads to significant defect densities, most prominently in the form of threading dislocations. Researchers are continually trying to reduce defect density as defects act as nonradiative recombination centers. In c-plane nitride growth, as well as other semiconductor materials systems, the threading dislocation defects predominantly propagate along the principal growth direction. As such, laterally growing polar and nonpolar nitrides tend to exhibit reduced defect densities. However, defect propagation in semipolar films is as yet unclear and will be important to future research and development efforts.

SUMMARY OF THE INVENTION

The present invention is a method of defect reduction for a semipolar nitride film, comprising performing a lateral growth of a semipolar nitride over a mask or gaps to reduce defect density in the semipolar nitride. The lateral growth may comprise a lateral epitaxial overgrowth (LEO), sidewall lateral epitaxial overgrowth (SLEO), cantilever epitaxy or nanomasking.

The step of performing the lateral growth may comprise the steps of: (a) selecting a semipolar nitride plane and composition; (b) selecting a suitable substrate for growth of the semipolar nitride plane and composition; and (c) applying a selective growth process in which the semipolar nitride nucleates on some areas of the substrate or template at the exclusion of other areas of the substrate or template, wherein the selective growth process includes the lateral growth of nitride material.

The step of applying may comprise applying a masking material that the nitride material does not adhere to during the selective growth process. Instead, the nitride material may adhere either to the substrate or template.

The step of applying may comprise defining elevated regions to act as nucleation sites for the nitride material.

The lateral growth of the nitride material may proceed until adjacent islands or stripes of the nitride material merge or coalesce, or the lateral growth of the nitride material results in uncoalesced laterally grown nitride material.

Finally, the multiple lateral growth may be performed multiple times.

Preferably, a device is fabricated using this method. In this regard, the end result is a semipolar nitride film having a reduced defect density compared to that which might be readily achieved without the use of the present invention. The use of such reduced defect density films as base layers for subsequent semipolar nitride device growth should yield higher performance devices than may be achieved without said defect reduction technique.

BRIEF DESCRIPTION OF THE DRAWINGS

Referring now to the drawings in which like reference numbers represent corresponding parts throughout:

FIGS. 4(a), (b) and (c) show a SLEO substrate immediately before growth (FIG. 4(a)), during growth (FIG. 4(b)), and after coalescence (FIG. 4(c)).

FIGS. 5(a), (b) and (c) show a cantilever substrate immediately before growth (FIG. 5(a)), during growth (FIG. 5(b)), and after coalescence (FIG. 5(c)).

FIGS. 6(a), (b) and (c) show a nanomasking substrate immediately before growth (FIG. 6(a)), during growth (FIG. 6(b)), and after coalescence (FIG. 3(c)).

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

Lateral growth is shown as a viable technique to reduce defect density in semiconductor films, including nitrides, such as GaN. The inventors have recently demonstrated growth of GaN on novel orientations that intersect the polarization vector at angles greater than zero and less than ninety degrees, which are designated as semipolar planes. The present invention describes a novel method for defect reduction via lateral growth in the developing field of semipolar nitrides. Lateral growth can be used to reduce defect density in semipolar nitride films by such growth techniques as LEO, SLEO, cantilever epitaxy, and nanomasking.

Technical Description

Research has recently lead to the development of GaN grown in semipolar orientations. Semipolar refers to any plane that has nonzero h or k and nonzero l Miller indices in the (hkl) convention of describing planes. Conventional nitrides are grown polar {0001}. Work has also been done on the two nonpolar orientations of {10$\bar{1}$0} and {11$\bar{2}$0}, for example, as was disclosed previously in the above-identified cross-referenced patent applications (specifically, U.S. Utility patent application Ser. Nos. 10/537,644 and 10/537,385).

Figure 1:
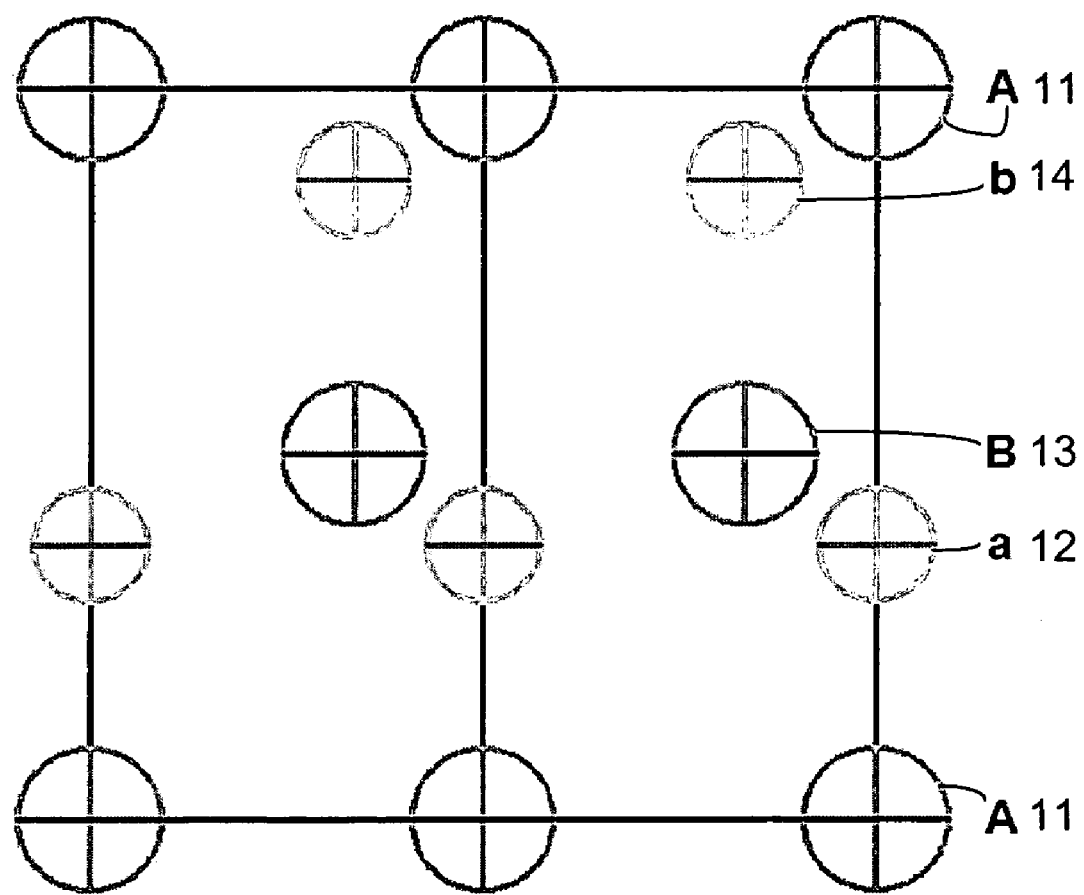
FIG. 1 illustrates AaBb stacking of GaN shown in the [11$\bar{2}$0] direction.
Figure 2:
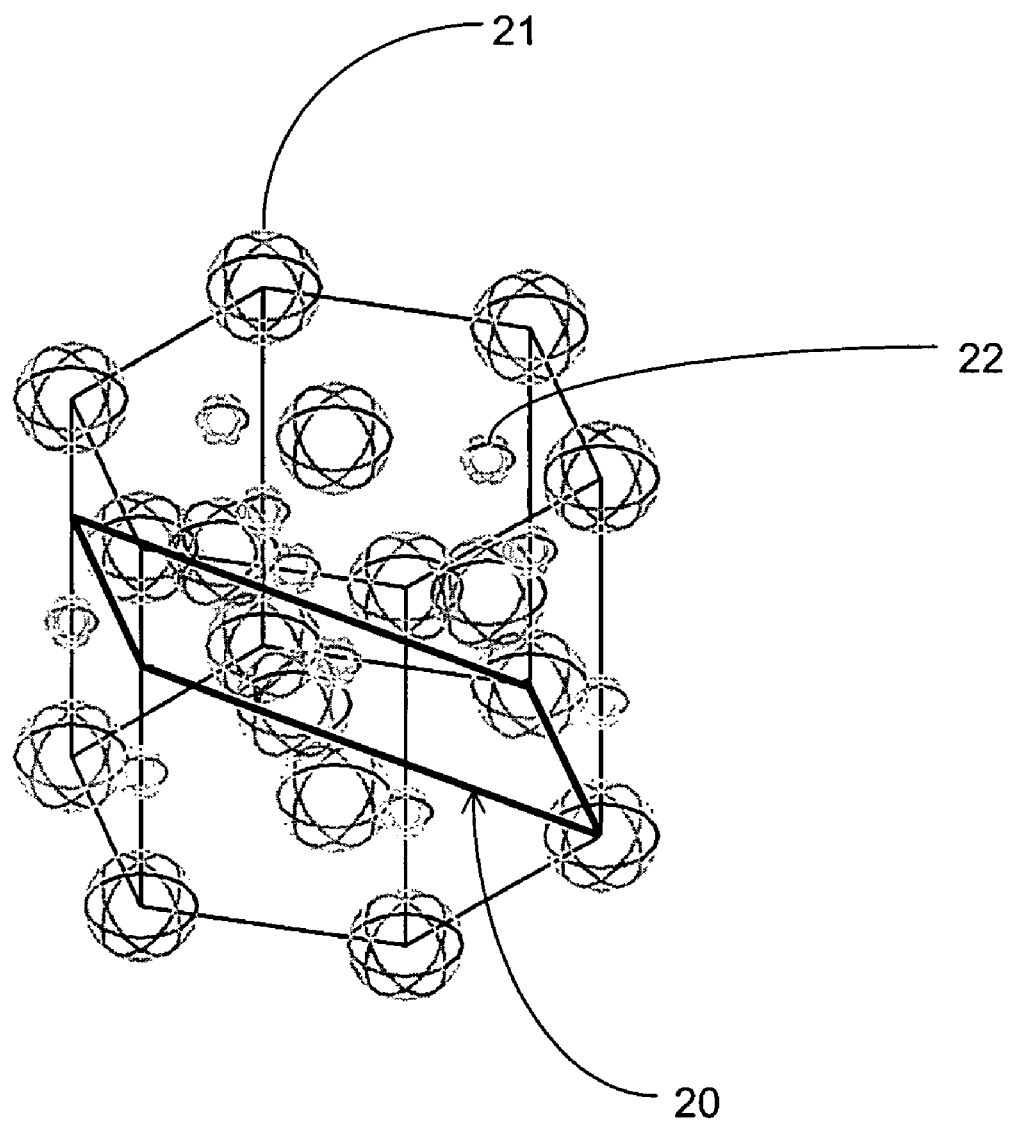
FIG. 2 illustrates an example of a semipolar plane, a {10$\bar{1}$3} plane.

Significant interest is developing in the growth of semipolar planes as well, though until recently no means existed to grow planar semipolar GaN films. However, the inventors have pioneered research on the three semipolar orientations of {10$\bar{1}$1}, {10$\bar{1}$3}, and {11$\bar{2}\bar{2}$}, as was disclosed previously in the above-identified cross-referenced patent applications. FIG. 2 shows an example of a semipolar plane (20), showing anions (21) and cations (22) sitting in planes stacked along the c direction.

The interest in semipolar orientations is mainly due to the reduction in polarization. Theoretical studies have suggested that the net polarization normal to certain semipolar surfaces is zero for specific strain states on specific planes. Furthermore, there are other properties that vary with growth orientation that are pertinent to growth quality and device performance, such as alloy incorporation (In or Al in GaN), dopant incorporation (Mg, Si), and dopant efficiency (good p-type). This variation in polarization and other properties gives each semipolar plane a unique character.

To further the development of semipolar nitrides, viable defect reduction techniques must be developed to improve the structural and electrical quality of the films. As-grown planar semipolar GaN films have been shown to contain $2 \times 10^9$ cm$^{-2}$ threading dislocations and $2 \times 10^5$ cm$^{-1}$ basal plane stacking faults. These dislocations and stacking faults are detrimental to the performance of optoelectronic and electronic devices. The most popular class of defect reduction techniques for polar and nonpolar nitrides has been based on lateral growth. There are four techniques that are used for lateral growth. They include, but are not limited to, LEO, SLEO, cantilever epitaxy, and nanomasking.

Prior to the present invention, none of these methods had been suggested for defect reduction in semipolar nitride films. However, the present invention describes methods required to achieve lateral growth, and the associated defect reduction, in semipolar nitride films. It must be stressed that any technique used for lateral growth to reduce defects in semipolar nitrides is included in this invention.

All of these lateral growth techniques have some aspects in common. First, there must be some selectivity in where the growth nucleates. This is usually achieved by applying a masking material that the nitride material does not adhere to during the selective growth process, or by defining elevated regions to act as nucleation sites for the nitride material. Likewise, there must be areas where the nitride material does adhere to, typically either the substrate or template. Second, the growth areas must grow laterally over the mask or gaps. In most instances, it is desirable to allow the lateral growth of the nitride material to proceed until adjacent islands or stripes of the nitride material merge or coalesce. However, for some applications, it is preferable to work with uncoalesced laterally grown nitride material as well.

For lateral growth processes, it is quite common to first start with a GaN template instead of a bare foreign substrate, such as sapphire or spinel. The lateral growth aspect quite often complicates the growth by narrowing and shifting the ideal parameter spaces. These complications can be mitigated somewhat by starting with a homoepitaxial template material, although doing so is not required for the practice of this invention.

FIGS. 3-7 illustrate lateral growth over a mask or gaps to reduce defect density in semipolar nitride films using LEO (FIG. 3), SLEO (FIG. 4), cantilever epitaxy (FIG. 5) and nanomasking (FIG. 6). In all these embodiments, the lateral growth may be performed on a bare substrate without a template.

Figures 3A, 3B, 3C:
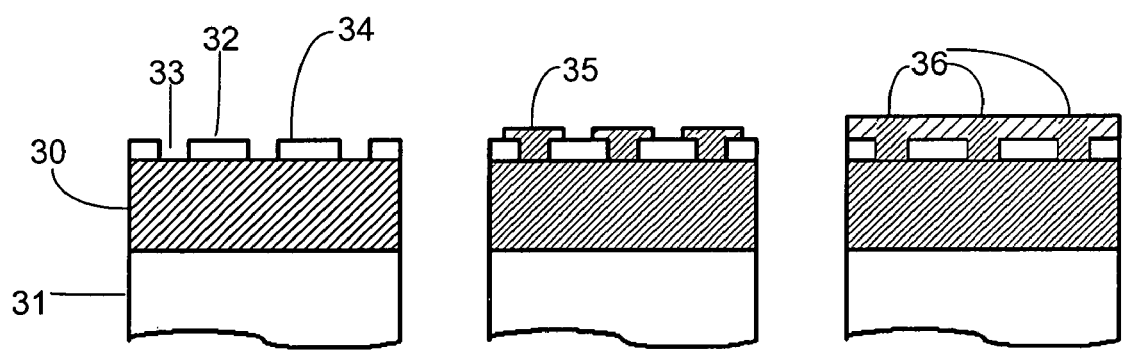
FIGS. 3(a), (b) and (c) show a LEO substrate immediately before growth (FIG. 3(a)), during growth (FIG. 3(b)), and after coalescence (FIG. 3(c)).

FIGS. 3(a), (b) and (c) show the LEO substrate immediately before growth (FIG. 3(a)), during growth (FIG. 3(b)), and after coalescence (FIG. 3(c)). In LEO, a template (30) on a substrate (31) is first coated with a masking material such as $SiO_2$ or silicon nitride ($SiN_x$). Conventional photolithographic process steps are applied to the mask (32) to delineate open "window" or gap regions (33) and coatable "wing" regions (34). The patterned template (30) or substrate (31) is then used for the lateral growth process, forming regrown nitride material (35) with low defect wing region (36) which grows over the mask (32) and gaps (33), and may or may not coalesce into a continuous surface. The masking material (32) may be such that the nitride material (35) does not adhere to it during growth.

FIGS. 4(a), (b) and (c) show a SLEO substrate immediately before growth (FIG. 4(a)), during growth (FIG. 4(b)), and after coalescence (FIG. 4(c)). SLEO, takes the LEO process one step further. After the windows (40) in the mask (41) are etched open, then the template (42) itself is etched to form ridge structures (43). The mask (41) is left on the top surfaces of the ridges. During the regrowth process, the regrown nitride material (44) proceeds laterally from the exposed nitride sidewalls (45), then grows vertically adjacent to the masked regions (46) propagating normal to the surface (47), and then grows laterally over the masked regions (46), possibly until coalescence occurs to form a low defect continuous surface (48). This process is potentially advantageous over LEO because essentially all the final surface area is a result of a lateral growth process and may exhibit lower average defect densities. The masking material (41) may be such that the nitride material (44) does not adhere to it during growth. Alternatively, this process may be performed directly on a bare substrate (49). The lateral growth forms the semipolar nitride film having the reduced defect density and a top surface 48 that is opposite the substrate's surface 47.

FIGS. 5(a), (b) and (c) show a cantilever substrate immediately before growth (FIG. 5(a)), during growth (FIG. 5(b)), and after coalescence (FIG. 5(c)). Cantilever epitaxy takes the processing steps of SLEO one step further. After the template (50) is etched to form ridges (51), the masking material is removed from the top surfaces (52). The sidewalls (53) are optionally coated with a mask material. In this way, the growth process is more similar to LEO except the mask is inverted. The grown nitride material (54) starts on the ridge tops (52) and laterally grows over gaps (56) between the ridges (51) to form at least one low defect wing region (57). The ridges (51) define elevated regions to act as nucleation sites for the nitride material (54). Alternatively, this process may be performed directly on a bare substrate (58).

FIGS. 6(a), (b) and (c) show a nanomasking substrate immediately before growth (FIG. 6(a)), during growth (FIG. 6(b)), and after coalescence (FIG. 6(c)). Nanomasking is very similar to LEO, except that photolithographic processing is not required in this process. In this case, a thin porous mask layer (60) is applied to a substrate (61) or template (62). The pores (63) in the mask (60) constitute the "windows" in the LEO process. This mask (60) may be formed ex situ, as has been performed with Ti deposition on c-plane GaN templates. An alternative approach is to deposit the mask in situ, as is often performed with $SiN_x$ nanomasking, in which a thin silicon nitride layer is deposited on the substrate (61) or template (62) in the same growth system as the nitride film growth 64 will occur. In nanomasking processes, the mask (60) is applied to the template (62) in a manner so that the mask (60) is not fully coalesced itself. Thus, there are natural windows in the mask (60), in this case, usually distributed in a random manner. This is in contrast to the precisely placed window stripes typical of LEO design. The nitride material 64 grows over the mask (60) and pores (63) and may or may not coalesce into a continuous surface 65.

Process Steps

The present invention can be realized in several forms, but all incarnations include several key steps or elements:

1. Selecting a semipolar nitride plane and composition.
2. Selecting a suitable substrate for growth of the semipolar nitride plane and composition.
3. Applying a selective growth process in which the semipolar nitride nucleates on some areas of the substrate at the exclusion of other areas of the substrate, wherein the selective growth process comprises the lateral growth of the nitride material.

Figure 7:
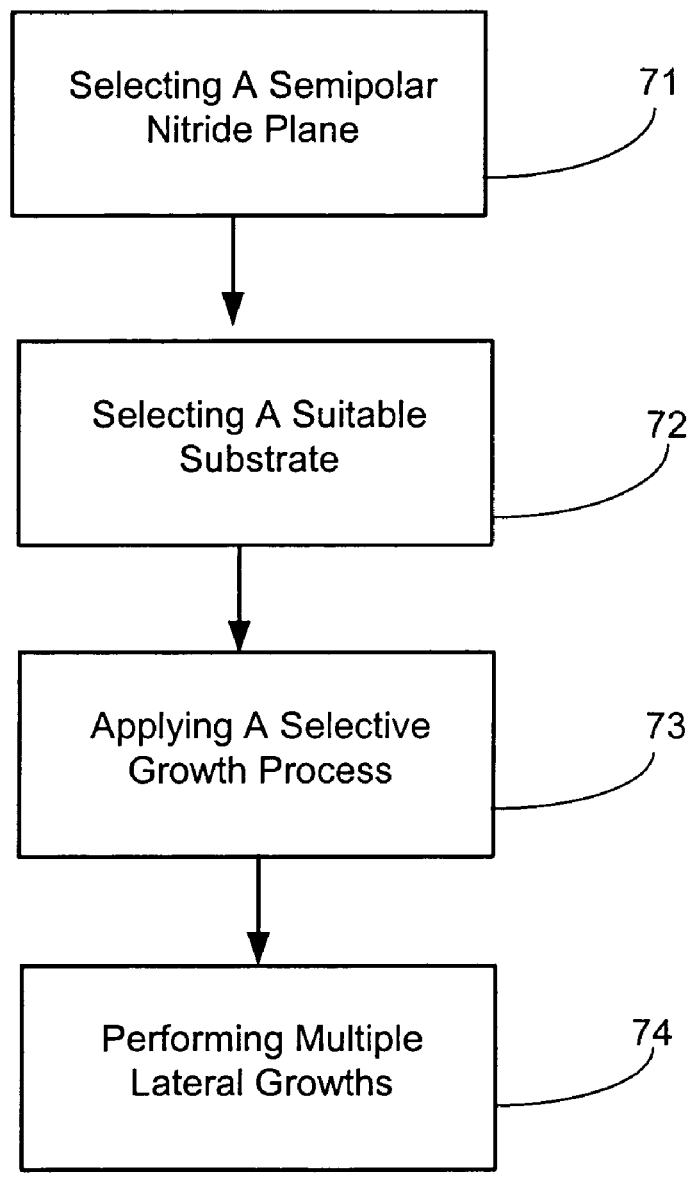
FIG. 7 illustrates the method of defect reduction for a semipolar nitride comprising performing a lateral growth to reduce defect density in semipolar nitride films.

FIG. 7 illustrates this method of defect reduction for a semipolar nitride comprising performing a lateral growth over a mask or gaps to reduce defect density in semipolar nitride films.

Block 70 represents the step of selecting the semipolar nitride plane and composition. The selection of the semipolar nitride plane is determined by several elements, including the phase stability of the plane, the angle of inclination of the plane relative to the polar c-axis, the desired atomic termination (polarity) of the growth surface, and the composition of the heterostructure layers to be grown. Any plane that is described by a set of Miller-Bravais indices {hki1} in which one or more of the h, k, or i indices and the 1 index are non-zero constitutes a semipolar plane and is covered by this disclosure. For example, the primary low-index semipolar planes in (Al, In, Ga)N crystals are the {10$\bar{1}$1}, {10$\bar{1}$2}, {10$\bar{1}$3}, {10$\bar{1}$4}, {20$\bar{2}$1}, and {11$\bar{2}$2} planes. It should be noted that the use of curly brackets, { }, denotes a family of symmetry-equivalent planes. Thus, the {10$\bar{1}$2} family includes the (10$\bar{1}$2), ($\bar{1}$012), (1$\bar{1}$02), ($\bar{1}$102), (0$\bar{1}$12), and (0$\bar{1}$12) planes. All of these planes will be terminated by group III atoms, meaning that the crystal's c-axis points away from the substrate. These families of planes also include the corresponding nitrogen terminated planes of the same indices. In other words, the {10$\bar{1}$2} family also includes the (10$\bar{1}\bar{2}$), ($\bar{1}$01$\bar{2}$), (1$\bar{1}$0$\bar{2}$), ($\bar{1}$10$\bar{2}$), (01$\bar{1}\bar{2}$), and (0$\bar{1}$1$\bar{2}$) planes. For each of these growth orientations, the crystal's c-axis will point towards the substrate. All of these planes within a single crystallographic family are equivalent for the purposes of this invention, although the choice of polarity can affect the behavior of the lateral growth process. Other unique higher-index planes can be selected without deviating from the scope of the present invention.

Block 71 represents the step of selecting a suitable substrate, which is determined by the choice of the semipolar nitride plane and by the substrate surface chemistry. For example, it has been demonstrated that (10$\bar{1}\bar{1}$) GaN will grow on (100) MgAl$_2$O$_4$ spinel substrates under standard growth conditions. If one desires to grow Ga-polar (10$\bar{1}$2) GaN, Si-terminated (10$\bar{1}$6) 6 H-SiC would be an appropriate substrate. Many such substrate materials are compatible with the present invention, including various orientations of sapphire (Al$_2$O$_3$), spinel (MgAl$_2$O$_4$), and silicon carbide (SiC). The choice of substrate does not fundamentally alter the practice of the invention so long as the substrate leads to the growth of nitride films in a semipolar orientation. The substrate may optionally be coated with a nitride template layer, of either similar (for example, homoepitaxial) or dissimilar composition to the nitride composition to be grown laterally. For example, the suitable substrate may comprise a template of, for example {10$\bar{1}$3} GaN grown on a (110) MgAl$_2$O$_4$ spinel substrate by, for example, HVPE.

Block 72 represents the step of applying a selective growth process in which the semipolar nitride nucleates on some areas of the substrate or template at the exclusion of other areas of the substrate or template, wherein the selective growth process comprises lateral growth of the nitride material. The choice or selection of a lateral growth technique will be driven largely by the wafer processing, the alloy composition, the defects to be eliminated, or the nitride film properties. For example, nanomasking techniques require minimal processing effort but may leave stacking faults in the over grown material while blocking dislocations. Nanomasking is also less effective for aluminum-containing nitride growths. Cantilever epitaxy is preferable for the growth of aluminum-containing nitrides because it relies on spatial selectivity rather than chemical selectivity for nucleation. Since aluminium nitride (AlN) will deposit on or adhere to most mask materials used in LEO, SLEO and nanomasking techniques, the lack of a chemically dissimilar mask during the growth process would be beneficial for semipolar AlN defect reduction. While different lateral growth techniques behave differently depending on the nitride composition being grown, they all share the fundamental trait that they involve selective lateral growth that results in defect reduction.

The step of applying represented in Block 72 may further comprise applying a masking material that the nitride material does not adhere to during growth. The masking material may have a stripe direction of <0001> or <11$\bar{2}$0>. The step may further comprise etching at least one ridge in the GaN by use of RIE, the ridge having a ridge depth from 10 nm to 100 μm. The step may also comprise defining elevated regions to act as nucleation sites.

In this step, nitride material may adhere to the substrate or template. The lateral growth of the nitride material may proceed until adjacent islands or stripes of the nitride material merge or coalesce. The lateral growth of nitride material may result in uncoalesced laterally grown nitride material. The growth may use any epitaxial growth method. For example, both the template growth and lateral growth may be by HVPE, or only the lateral growth may be by HVPE.

As a result of this step, the defect density of the semipolar nitride will be reduced in the wing regions compared to the window regions giving a net total decrease in defect density and the laterally grown film should be of sufficient quality to use for device growth, with less than 2×10$^9$ cm$^{-2}$ threading dislocations and less than 2×10$^5$ cm$^{-1}$ basal plane stacking faults. For example, the top surface (e.g., 48 in FIG. 4(c)) of the semipolar film may be a semipolar plane and comprise the reduced defect density.

Block 74 represents the step of performing the lateral growth multiple times to further decrease the dislocation density. For example, the multiple lateral growth may comprise double LEO placing second window regions over first wing regions.

Steps may be omitted or added as desired. A device may be fabricated using the method.

There could be many relevant versions of the preferred embodiment. For illustrative purposes only, a few possible incarnations of the invention will be given for example, with variations covered in the modifications section.

First, grow 15 μm of {10$\bar{1}$3} GaN on a (110) MgAl$_2$O$_4$ spinel substrate by HVPE. This will serve as a template and mitigate nucleation issues for the regrowth step. Next, coat the template with 1000 to 2000 Å of SiO$_2$ using Plasma Enhanced Chemical Vapor Deposition (PECVD). Then, spin coat the SiO$_2$ with 4210 photoresist and perform a softbake. Expose the photoresist to a suitable masking pattern via photolithography. An example of a suitable masking pattern would be parallel stripes with a 5 μm opening. The stripe direction could be <0001> or <11$\bar{2}$0>, for example. Hardbake the exposed photoresist and develop with AZ400K to open windows in the photoresist to expose the SiO$_2$. Etch the SiO$_2$ in a solution of HF to create windows open to expose the GaN template. Remove the photoresist with acetone and isopropanol. Lastly, regrow on the patterned substrate with HVPE for another 15 μm to achieve a coalesced reduced defect density semipolar GaN film.

At this point, the defect density of the template will be reduced in the wing regions as compared to the window regions, giving a net total decrease in defect density. If the growth parameters are selected appropriately, the laterally grown film should be of sufficient quality to use for device growth. The template could be used for growth of LEDs or LDs by MOCVD or MBE.

It should be noted that the inventors have demonstrated the previously stated example, with the exception of the first template step. In the preliminary stages, it was observed that lateral growth and coalescence did in fact occur on this semipolar orientation. It is believed that this is the first lateral growth of any semipolar nitride.

The second example will be SLEO by MOCVD and the process starts quite similarly to the previous example. First, grow 15 μm of {10$\bar{1}$3} GaN on a (110) spinel substrate by HVPE. Next, coat the GaN with ~3 μm of SiO$_2$ using PECVD. Then, spin coat the SiO$_2$ with 4210 photoresist and perform the softbake. Expose the photoresist to a suitable masking pattern via photolithography. Hardbake the exposed photoresist and develop with AZ400K to open windows in the photoresist to expose the SiO$_2$. Etch the SiO$_2$ in a solution of HF to create windows to expose the GaN template. In contrast to LEO, the next step is to etch at least one ridge in the GaN by use of RIE. The ridge depth could range in height from 10 nm to 100 μm. Remove the photoresist with acetone and isopropanol. Lastly, regrow on the patterned substrate with MOCVD for a sufficient time to overgrow the masking material.

Possible Modifications and Variations

The benefits of this invention are pertinent to any lateral growth technique for use on any of the semipolar planes in the nitride system. One could create any permutation of this idea to incur the benefits thereof. For example, one could do cantilever epitaxy of {10$\bar{1}$1} AlN by HVPE or MOCVD. One could do LEO of {10$\bar{1}$3} InGaN by MOCVD. One could grow {11$\bar{2}$2} GaN by HVPE with the use of in-situ nanomasking. A nitride template may or may not be used in the lateral growth process.

Other semipolar orientations could be grown given further development of substrate and orientation-combinations.

These orientations would also have reduced polarization and unique properties of semipolar nitrides, such as alloy/dopant incorporation, and good p-type dopant efficiency. Many possible film orientations were described in the preferred embodiment. However, the planes mentioned above do not limit the applicability of the present invention to those planes alone. The present invention is compatible with any semipolar nitride film orientation.

Another variation is the use of multiple lateral growth steps to further decrease the dislocation density. For example, one could perform a double LEO and place the second window regions over the first LEO wing regions. The present invention is compatible with performing the lateral growth multiple times.

Advantages and Improvements

The benefits of lateral growth of semiconductors, including nitrides, have been well established to reduce defect density, specifically, the density of threading dislocations. Lateral growth techniques have been applied to polar and nonpolar orientations of GaN. The present invention demonstrates a method for the application of lateral growth to reduce defects in semipolar orientations of nitrides. Prior to the present invention, no means existed to achieve reduced defect densities in semipolar nitride films.

The key difference between lateral growth for semipolar nitrides as compared to lateral growth for polar and non-polar nitrides is that the defects are inclined with respect to the surface for semipolar; whereas for other orientations, the defects are propagated normal to the surface.

REFERENCES

The following publications are incorporated by reference herein:

[1] Haskell, B. A., "Defect reduction in (11$\bar{2}$0) a-plane gallium nitride via lateral epitaxial overgrowth by hydride vapor phase epitaxy," Applied Physics Letters, Volume 83, Number 4, p. 644 (28 Jul. 2003).

[2] Haskell, B. A., "Defect reduction in (1$\bar{1}$00) m-plane gallium nitride via lateral epitaxial overgrowth by hydride vapor-phase epitaxy," Applied Physics Letters, Volume 86, 111917 (2005).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A method of defect reduction for a semipolar nitride film, comprising:
   performing a lateral growth of a semipolar nitride over a mask or gaps on or above a top surface of a substrate, to reduce defect density in the semipolar nitride, resulting in the semipolar nitride film having less than $2 \times 10^9$ cm$^{-2}$ threading dislocations and a top surface of the semipolar nitride film that is a semipolar plane, wherein the top surface of the semipolar nitride film is planar and parallel to the top surface of the substrate.

2. The method of claim 1, wherein the lateral growth is a lateral epitaxial overgrowth (LEO).

3. The method of claim 1, wherein the lateral growth is a sidewall lateral epitaxial overgrowth (SLEO).

4. The method of claim 1, wherein the lateral growth is a cantilever epitaxy.

5. The method of claim 1, wherein the lateral growth is a nanomasking.

6. The method of claim 1, wherein the step of performing the lateral growth comprises the steps of:
   selecting a semipolar nitride plane and composition;
   selecting a suitable substrate for growth of the semipolar nitride plane and composition; and
   applying a selective growth process in which the semipolar nitride nucleates on some areas of the substrate or template at the exclusion of other areas of the substrate or template due to the mask or gaps, wherein the selective growth process includes the lateral growth of nitride material.

7. A device fabricated using the method of claim 1.

8. The method of claim 1, resulting in the semipolar nitride film comprising less than $2 \times 10^5$ cm$^{-1}$ basal plane stacking faults.

9. The method of claim 1, wherein the semipolar nitride film is a base layer for subsequent semipolar nitride device growth.

10. The method of claim 6, wherein the step of applying comprises applying a masking material that the nitride material does not adhere to during the selective growth process.

11. The method of claim 6, wherein the step of applying comprises defining elevated regions to act as nucleation sites for the nitride material.

12. The method of claim 6, wherein the lateral growth of the nitride material proceeds until adjacent islands or stripes of the nitride material merge or coalesce.

13. The method of claim 6, wherein the lateral growth of the nitride material results in uncoalesced laterally grown nitride material.

14. The method of claim 6, further comprising performing the lateral growth multiple times.

15. The method of claim 10, wherein the nitride material adheres to the substrate or template.

16. A semipolar nitride film, laterally grown over a mask or gaps on or above a top surface of a substrate, having less than $2 \times 10^9$ cm$^{-2}$ threading dislocations and a top surface that is a semipolar plane, wherein the top surface of the semipolar nitride film is planar and parallel to the top surface of the substrate.

17. The film of claim 16, wherein the semipolar nitride film is a base layer for subsequent semipolar nitride device growth.

18. A semipolar nitride film, laterally grown over the mask or gaps on or above a top surface of a substrate, having less than $2 \times 10^5$ cm$^{-1}$ basal plane stacking faults and a top surface that is a semipolar plane, wherein the top surface of the semipolar nitride film is planar and parallel to the top surface of the substrate.

19. The film of claim 18, wherein the semipolar nitride film is a base layer for subsequent semipolar nitride device growth.

* * * * *